(12) United States Patent
Blaney et al.

(10) Patent No.: US 7,728,613 B2
(45) Date of Patent: Jun. 1, 2010

(54) DEVICE UNDER TEST POGO PIN TYPE CONTACT ELEMENT

(75) Inventors: Gerard Blaney, Croom (IE); John Grubb, Fedamore (IE); Niall Nolan, Castletroy (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/975,043

(22) Filed: Oct. 17, 2007

(65) Prior Publication Data

US 2008/0116924 A1    May 22, 2008

Related U.S. Application Data

(60) Provisional application No. 60/860,154, filed on Nov. 20, 2006.

(51) Int. Cl.
  *G01R 31/02* (2006.01)
(52) U.S. Cl. ..................................................... 324/761
(58) Field of Classification Search ........................ None
  See application file for complete search history.

(56) References Cited

U.S. PATENT DOCUMENTS

| | | | | |
|---|---|---|---|---|
| 5,461,327 A * | 10/1995 | Shibata et al. | ............... | 324/760 |
| 6,281,690 B1 * | 8/2001 | Frey | ............................ | 324/754 |
| 6,288,555 B1 * | 9/2001 | Harris | ......................... | 324/761 |
| 6,626,682 B2 | 9/2003 | Sausen | | |
| 6,734,689 B1 * | 5/2004 | Yang | ............................ | 324/754 |
| 6,897,672 B2 * | 5/2005 | Byrd | ............................ | 324/765 |
| 6,957,005 B2 * | 10/2005 | Saulnier et al. | ............. | 324/757 |
| 7,042,240 B2 | 5/2006 | Lopez et al. | | |
| 7,219,418 B2 * | 5/2007 | Byrd | ............................ | 324/761 |
| 7,253,648 B2 * | 8/2007 | Yang | ............................ | 324/754 |
| 7,466,153 B2 * | 12/2008 | Kim | ............................. | 324/754 |
| 2002/0013085 A1 * | 1/2002 | Boyle et al. | .................. | 439/482 |
| 2004/0008048 A1 * | 1/2004 | Florence et al. | ............. | 324/761 |
| 2005/0189957 A1 | 9/2005 | Lopez | | |
| 2006/0145718 A1 | 7/2006 | Lopez et al. | | |
| 2006/0164111 A1 | 7/2006 | Lopez et al. | | |
| 2006/0267604 A1 * | 11/2006 | Yang | ............................ | 324/754 |
| 2007/0018667 A1 * | 1/2007 | Kinoshita | .................... | 324/761 |
| 2007/0024305 A1 * | 2/2007 | Kim | ............................. | 324/761 |
| 2008/0116922 A1 * | 5/2008 | Blaney et al. | ................ | 324/760 |
| 2008/0150569 A1 * | 6/2008 | Barabi et al. | ................. | 324/761 |

FOREIGN PATENT DOCUMENTS

JP           02047554 A  *  2/1990

* cited by examiner

*Primary Examiner*—Jermele M Hollington
(74) *Attorney, Agent, or Firm*—Sunstein Kann Murphy & Timbers LLP

(57) ABSTRACT

A device under test pogo pin type contactor features an active head and an electronic component associated with the active head. A tip is spaced from the active head and a biasing device is between the active head and the tip for biasing the active head against a device under test.

15 Claims, 6 Drawing Sheets

DEVICE UNDER TEST POGO PIN TYPE CONTACT ELEMENT

RELATED APPLICATIONS AND PRIORITY CLAIM

This application claims priority to U.S. provisional application Ser. No. 60/860,154 filed Nov. 20, 2006 incorporated herein by this reference.

FIELD OF THE INVENTION

This subject invention relates to testing systems and devices.

BACKGROUND OF THE INVENTION

Pogo pins are typically used as contacts or probes in testing systems. For example, a contactor, used to electrically test integrated circuit chips loaded in a test chuck, may include pogo pins, the heads of which contact portions of the chip (e.g., an exposed paddle, device leads, or the like). A load board is electrically connected to the contactor and provides signals to the contactor and processes signals from the contactor via the pogo pins. U.S. Patents and Published Patent Applications Nos. U.S. Pat. Nos. 7,042,240; 6,626,682; 2005/0189957; 2006/0164111; and 2006/0145718, relate to various testing system and all incorporated herein by this reference.

In some cases, it is desirable to include in a contactor a temperature sensor (e.g., a thermistor) or other active component to determine one or more characteristics of the device under test (e.g., a chip or an array of chips on a strip). The parasitic effects of regular contact sets with such components are undesirable.

BRIEF SUMMARY OF THE INVENTION

It is therefore an object of this invention to provide a new type of active component for testing and/or evaluating a device such as an integrated circuit chip.

It is a further object of this invention to provide such a component with reduced parasitic effects.

The subject invention results from the realization that if a pogo pin is designed to include an integral electronic component such as a thermistor, the pogo pin can be used in connection with a contactor which already includes regular pogo pins to simplify the design of the contactor and reduce the parasitic effect of regular contact sets.

The subject invention features a device under test pogo pin type contactor comprising an active head, an electronic component such as a sensor associated with the active head, a tip spaced from the active head, and a biasing device such as a spring between the active head and the tip for biasing the active head against a device under test. In one example, the sensor is a thermistor for measuring the temperature of the device under test. Other sensors include, a crystal oscillator, an inductor, a diode, a reference capacitor, a reference resistor or a fuse. Typically, the electronic component is coupled to the active head via a conductive adhesive. In this way, there is an electrical path from the tip through the spring to the electronic component.

The subject invention also features a testing apparatus including a contactor with a pogo pin having an active head for contacting the device under test, an electronic component such as a temperature sensor associated with the active head (e.g., for measuring the temperature of the device under test), a tip spaced from the active head for contacting a load board, and a spring between the active head and the tip for biasing the active head against the device under test. A test chuck brings the device under test into contact with the contactor and the test chuck may include means for heating the device under test to a temperature measured by the pogo pin.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
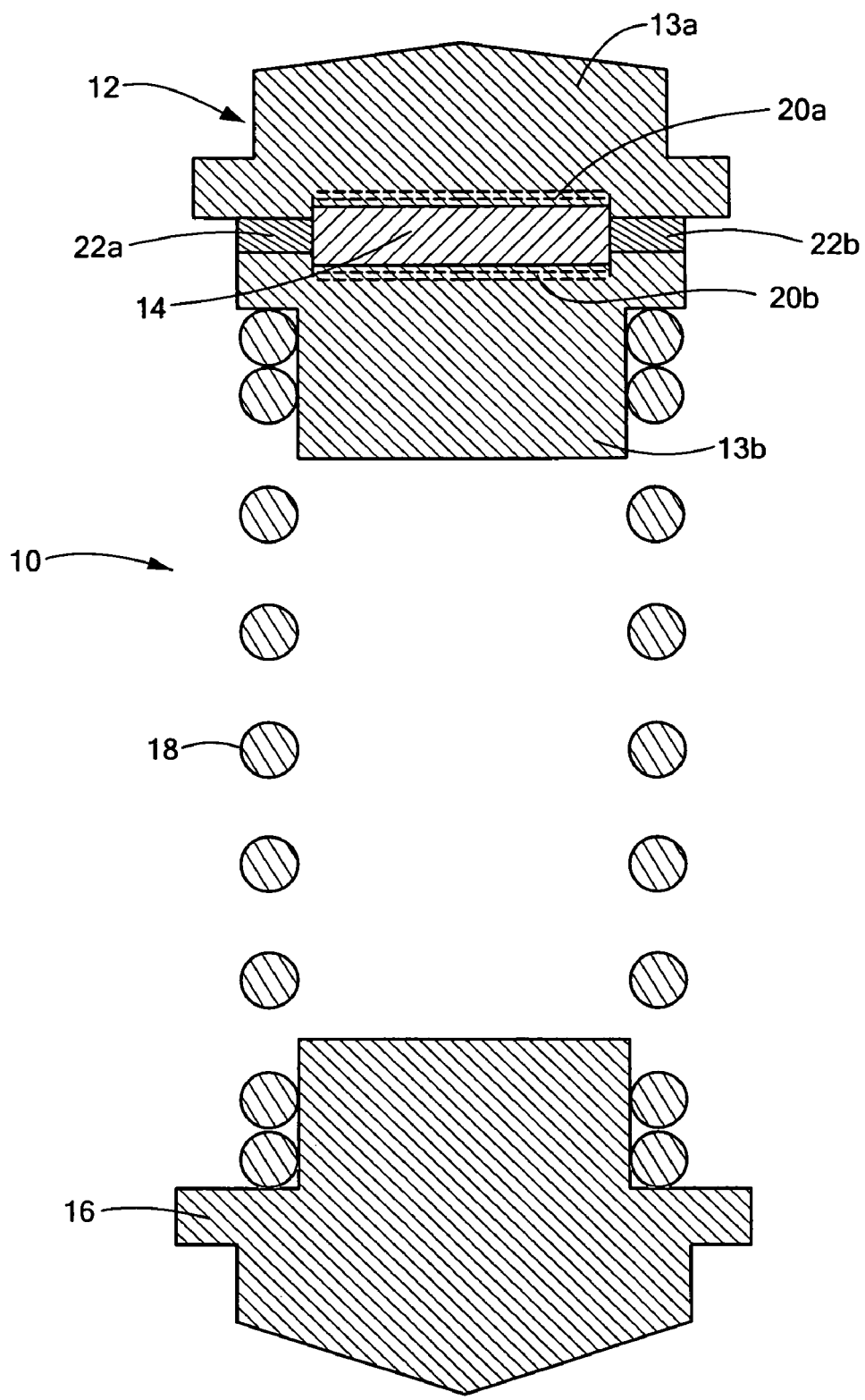
FIG. 1 is a highly schematic cross-sectional front view of a device under test pogo pin type contactor in accordance with the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

FIG. 1 shows pogo pin 10 in accordance with this invention. Active head 12 includes an integral electronic component such as sensor 14. Sensor 14 may be a 0.9 mm ×0.9 mm thermistor die; a crystal oscillator, an inductor, a veractor diode, a reference capacitor or resistor (e.g., for calibration) or any desired component other electronic components including a fuse. Pogo pin tip 16 is separated from head by spring (or telescoping barrel) 18 which biases head 12 away from tip 16.

Thermistor die 14 is placed between head portions 13a and 13b and conductive adhesive layers 20a and 20b are used in this example to bond the top and bottom of a thermistor die together with head 12 and to provide an electrical connection to the thermistor die. Head 12 is modified in this example to fit in a thermistor die but other possibilities include the incorporation of a passive electronic component, a transducer, or other sensor. Non-conductive adhesive may be used as shown at 22a and 22b to strengthen the assembly.

Metal head 12 contacts a device under test (e.g., an exposed paddle of an integrated circuit chip) and there is a thermal path of only approximately 0.5 mm to thermistor die 14 which reduces the parasitic effects inherent with the use of regular contact sets. Electrical contact with sensor 14 is via spring 18 to tip 16 which typically connects to an application board.

Figure 2:
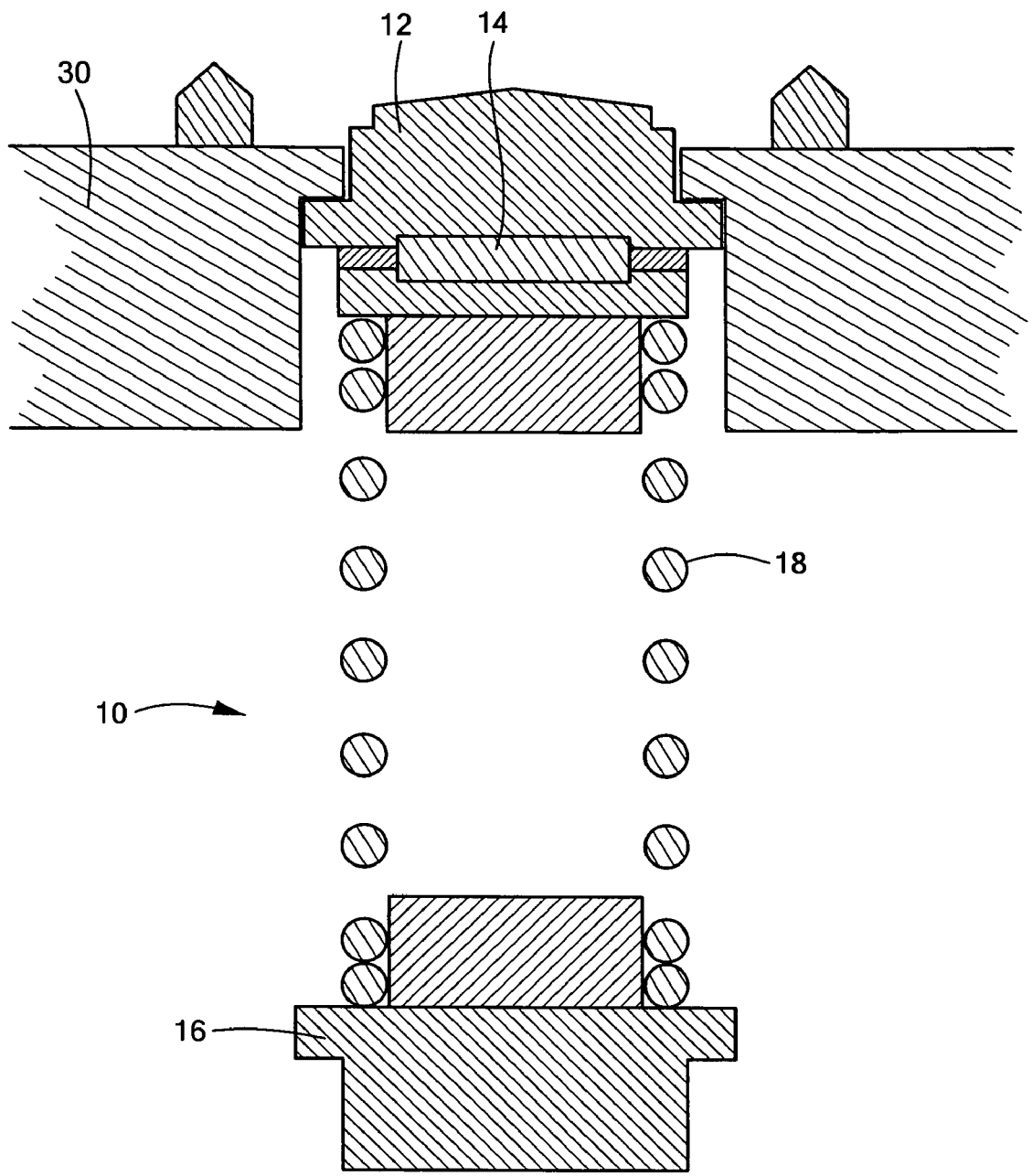
FIG. 2 is a highly schematic cross-sectional front view showing the pogo pin of FIG. 1 fitted within a contactor of a test system.
Figure 3:
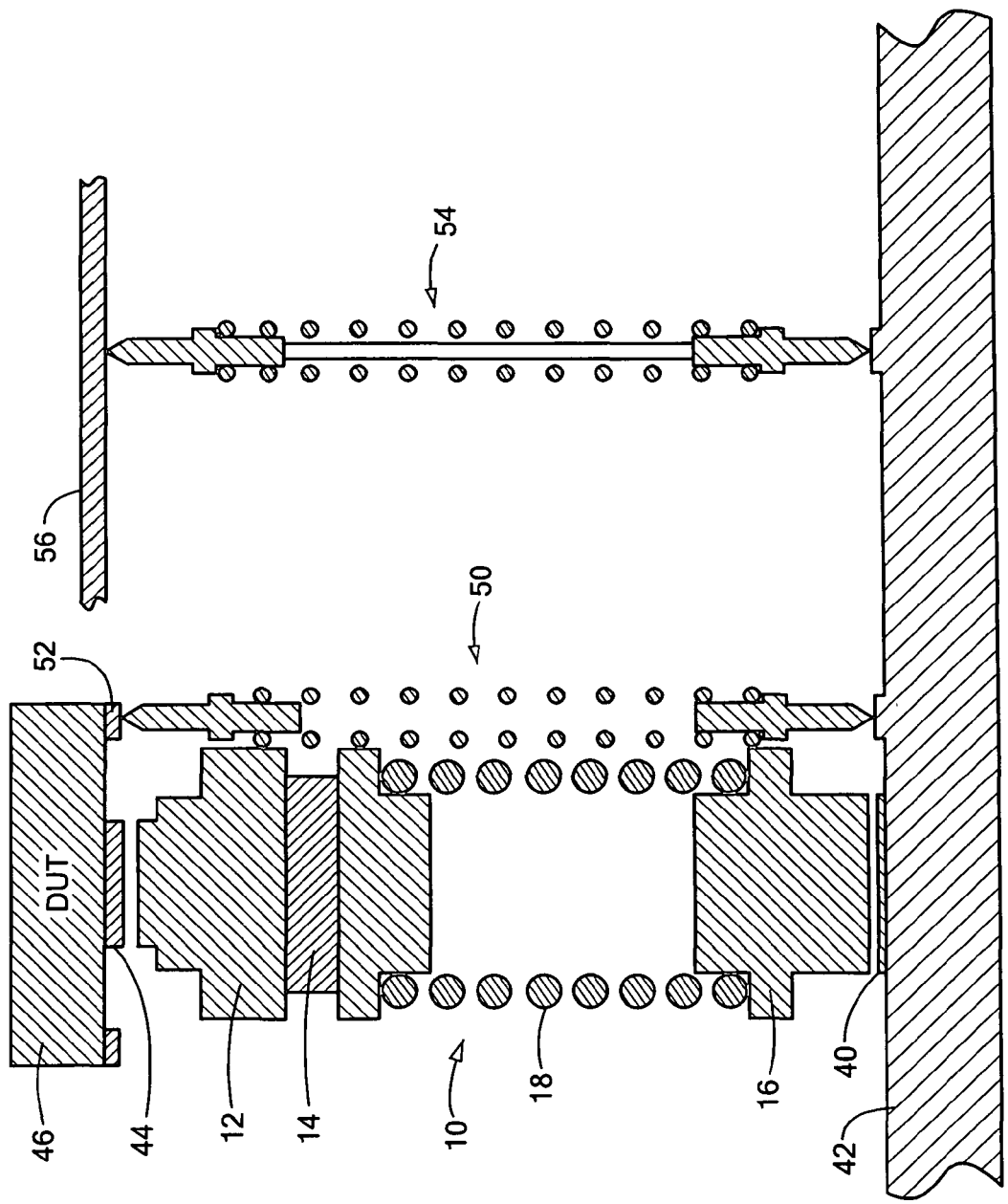
FIG. 3 is a schematic cross-sectional view showing how the pogo pin of FIGS. 1 and 2 can be used to test a device under test.

FIG. 2 shows pogo pin 10 mounted in contactor body 30. Even in the case of a misalignment in body 30, there is still good contact of head 12 with the device under test. FIG. 3 shows pogo pin 10 with tip 16 contacting a pad 40 on application board 42 and head 12 contacting a pad, a lead, or a body ground portion 44 of device under test 46. FIG. 3 also shows regular pogo pin 50 contacting device under test 46 lead pad 52 for electrically testing the device under test and pogo pin 52 contacting lead frame 56 providing a common electrical connection to the temperature sensor for reading the temperature of the device under test. Typically, the electrical terminals of the sensor are on the top and bottom to provide an electrical connection if required. In one example, tip 16 connects to application board 42, head 12 contacts the device under test or an exposed paddle of the device under test which is connected to the lead frame of a test strip. Regular pogo pin 54 connects the lead frame to the application printed circuit board to complete the electrical circuit and therefore measure the value of thermistor 14.

Figure 4:
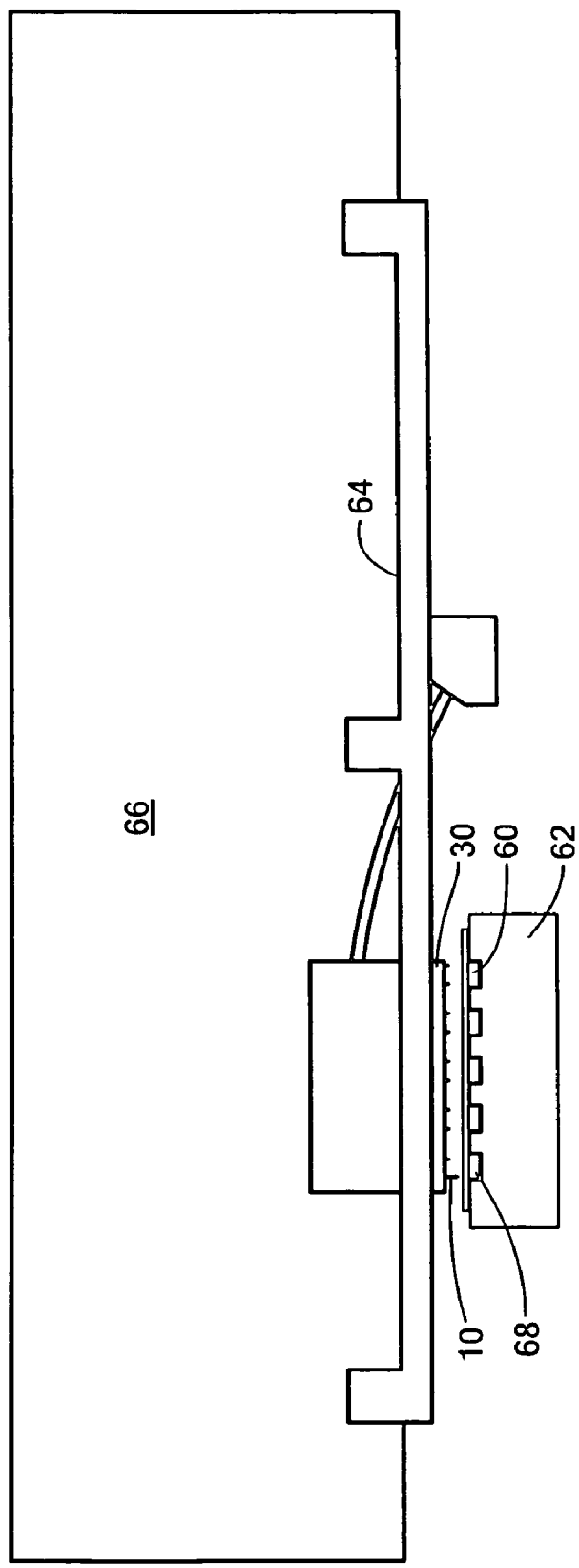
FIG. 4 is a schematic cross-sectional view showing the primary components associated with a testing system including a pogo pin contactor in accordance with the subject invention.

FIG. 4 shows an example of another use for the subject invention. Contactor 30 includes pogo pin 10 (as well as other regular pogo pins) which can be brought into contact with test strip 60 in test chuck 62. Contactor 30 is connected to load board 64 of test head 66. Test strip 60 includes an array of integrated circuit chips such as integrated circuit chip 68.

Often, test chuck 62 includes a heater to heat the test strip and its integrated circuits for testing. Also, an integrated circuit may include an integral temperature sensor which must be calibrated. Such an integrated circuit chip is heated to a predetermine temperature (or range of temperatures) by test chuck 62, the output of the temperature sensor of the integrated circuit is read by the load board 20 via contactor 16, and the integrated circuit temperature sensor is then trimmed until its temperature matches the temperature of the test chuck.

If strip 60 is not correctly seated in test chuck 62, its temperature may be lower than the expected temperature resulting in the integrated circuit being trimmed to incorrect values.

Pogo pin 10, in accordance with the subject invention, can be used to more directly measure the temperature of test strip 60 as heated by test chuck 62 in order to trim an integrated circuit chip with a temperature sensor to the correct value or values. Moreover, the use of golden test strips can be eliminated by positioning temperature sensors in small pogo pin structures biased against the exposed metal paddle of the device under test. In this way, it is possible to detect whether or not the strip is correctly and properly seated on the test chuck by placing the small pogo pin structures at various positions on the strip metal. The circuit for the thermistor is completed by a regular pogo pin placed elsewhere on the strip. The small pogo pin structures can be calibrated in an oil bath eliminating the need for golden test strips.

Figure 5:
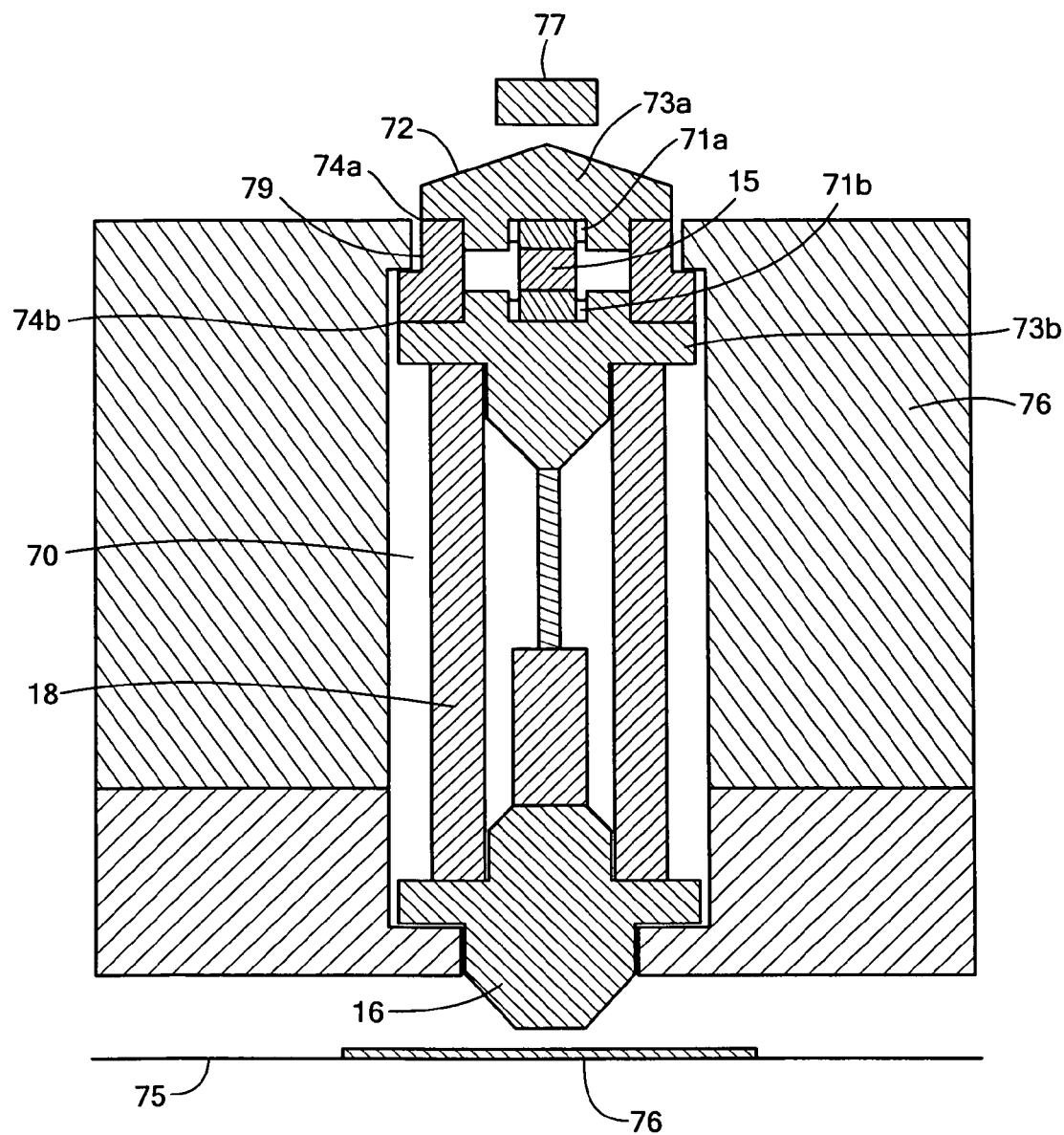
FIGS. 5 and 6 are schematic cross sectional views showing an example of a pogo pin contactor in accordance with the subject invention incorporated in a contactor.

FIG. 5 shows an example of pogo pin 70 in accordance with this invention. Active head 72 includes a electronic component 15. Electronic component 15 may be a 0201 Surface Mount Technology (SMT) packaged device; a crystal oscillator, an inductor, a veractor diode, a reference capacitor, a fuse or resistor (e.g., for calibration) or any desired component. Electronic component 15 is placed between head portions 73a and 73b and conductive adhesive fillets 71a and 71b (e.g. solder or conductive die attach) are used in this example to bond the two electrical terminal of the electronic component 15 together with head 72 portions 73a and 73b and to provide an electrical connection to the electronic component 15. An electrically isolative housing 79 isolates the active head 72 portions 73a and 73b. Non-conductive adhesive may be used as shown at 74a and 74b to strengthen the assembly.

Active head 72 contacts a device under test (e.g., integrated circuit chip package lead 77) and there is an electrical path of less than 0.5 mm to electronic component 15 which reduces the parasitic effects inherent with the use of regular contact sets. Electrical contact with electronic component 15 is via spring 18 (or telescoping barrel) to tip 16 which typically connect application board 75 lead 76.

Figure 6:
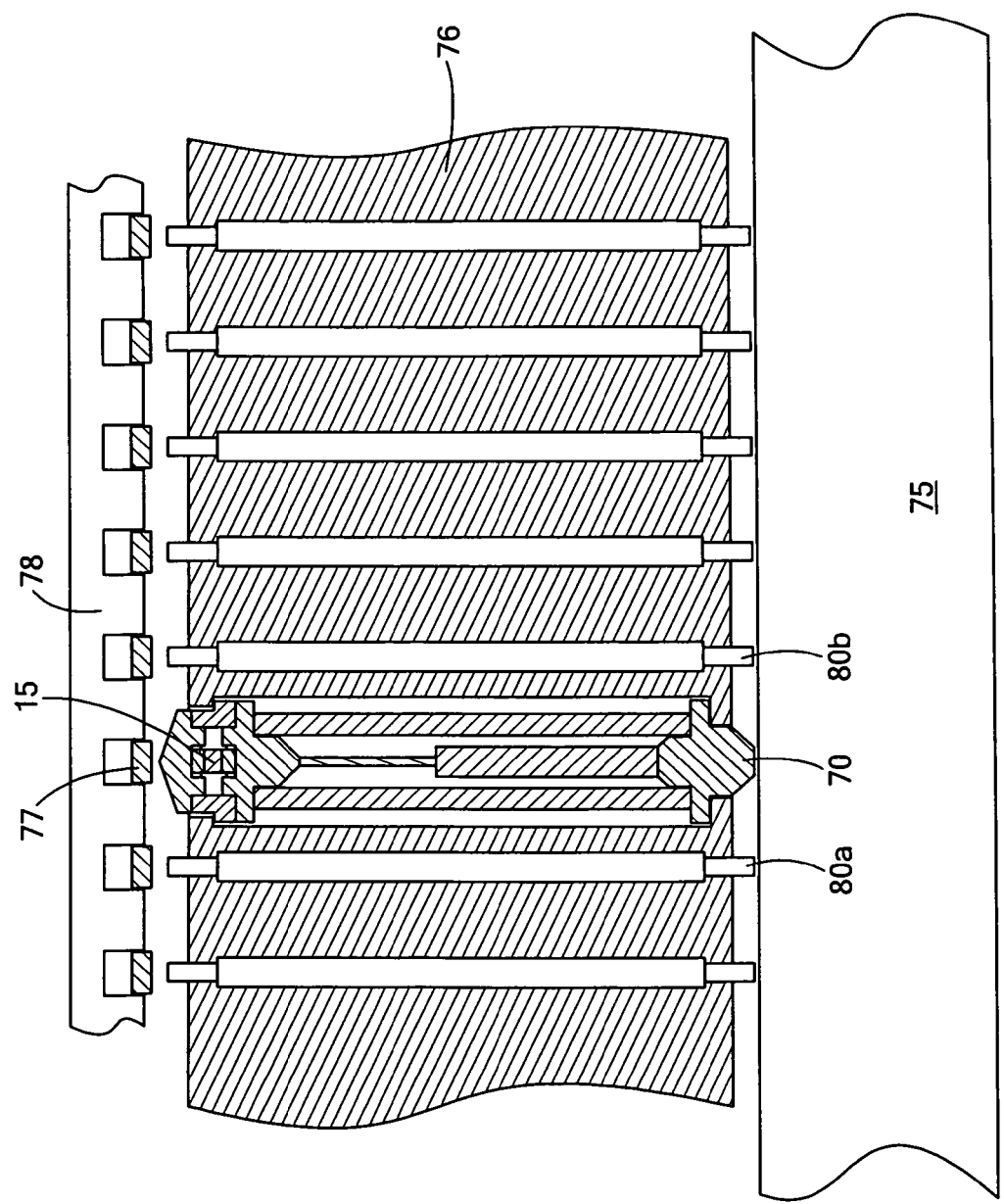

FIGS. 5-6 show pogo pin 70 mounted in contactor housing 76 as it could be arranged with regular pogo pins 80a, 80b, and the like. The electronic component 15 is positioned with an electrical path of less than 0.5 mm from the desired terminal lead 77 of the device under test 78 which reduces the parasitic effects inherent with the use of regular contact sets.

Other uses for a pogo pin with an integral thermistor or other component are within the scope of the subject invention. Thus, although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A device under test pogo pin type contact element comprising:
    an active head for contacting a device under test;
    an electronic component coupled to the active head;
    an electronic connection between the active head and the electronic component, the electronic connection for passing electronic test signals between the device under test and the electronic component;
    a tip spaced from the active head; and
    a biasing device between the active head and the tip for biasing the active head against the device under test.

2. The pogo pin type contactor of claim 1 in which the biasing device is a spring.

3. The pogo pin type contactor of claim 1 in which the electronic component includes at least one of a temperature sensor, a crystal oscillator, an inductor, a diode, a fuse, a capacitor, and a resistor.

4. The pogo pin type contactor of claim 1 in which the electronic component is coupled to the active head via a conductive adhesive.

5. The pogo pin type contactor of claim 1 in which there is an electrical path from the tip through the biasing device to the electronic component.

6. A testing apparatus for a device under test, the apparatus comprising:
- a contactor including a pogo pin with an active head for contacting the device under test;
- an electronic component coupled to the active head;
- an electronic connection between the active head and the electronic component, the electronic connection for passing electronic test signals between the device under test and the electronic component;
- a tip spaced from the active head for contacting a load board, and a spring between the active head and the tip for biasing the active head against the device under test; and
- a test chuck for bringing the device under test into contact with the contactor.

7. A testing apparatus for a device under test, the apparatus comprising:
- a contactor including one or more pogo pins; and
- at least one said pogo pin including:
    - an active head with an electronic component integral therewith; and
    - an electronic connection to the active head for passing electronic test signals between the device under test and the electronic component.

8. A modified pogo pin for a device under test contactor, the modified pogo pin comprising:
- an active head configured with an electronic component therein;
- a biasing device between the active head and a pogo pin tip biasing the active head against the device under test and the pogo pin tip against an application board;
- a first short path from the electronic component to the device under test through the active head, the first short path for passing electronic test signals between the device under test and the electronic component; and
- a second path from the electronic component to the application board through the pogo pin tip, the second short path for passing electronic test signals between the electronic component and the application board.

9. The modified pogo pin of claim 8 further including an insulative housing between the active head and the contactor.

10. The modified pogo pin of claim 8 in which the first short path is less than 0.5 mm.

11. The pogo pin type contactor of claim 1 in which the electronic component determines one or more characteristics of the device under test.

12. A device under test pogo pin type contact element comprising:
- an active head for contacting a device under test;
- an electronic component coupled to the active head, the electronic component having an electronic connection to the active head for passing electronic signals between the device under test and the electronic component, the electronic component including at least one of a temperature sensor, a crystal oscillator, an inductor, a diode, a fuse, a capacitor, and a resistor;
- a tip spaced from the active head; and
- a biasing device between the active head and the tip for biasing the active head against the device under test.

13. The pogo pin type contactor of claim 12 in which the biasing device is a spring.

14. The pogo pin type contactor of claim 12 in which the electronic component is coupled to the active head via a conductive adhesive.

15. The pogo pin type contactor of claim 12 in which there is an electrical path from the tip through the biasing device to the electronic component.

* * * * *